(12) United States Patent  
Giles

(10) Patent No.: US 7,749,875 B2  
(45) Date of Patent: Jul. 6, 2010

(54) METHOD OF MANUFACTURING A SEMICONDUCTOR ELEMENT AND SEMICONDUCTOR ELEMENT

(75) Inventor: Luis-Felipe Giles, Munich (DE)

(73) Assignee: Infineon Technologies AG, Neubiberg (DE)

( * ) Notice: Subject to any disclaimer, the term of this patent is extended or adjusted under 35 U.S.C. 154(b) by 433 days.

(21) Appl. No.: 11/675,889

(22) Filed: Feb. 16, 2007

(65) Prior Publication Data

US 2008/0197383 A1 Aug. 21, 2008

(51) Int. Cl.  
*H01L 21/425* (2006.01)

(52) U.S. Cl. ................ 438/517; 438/473; 438/510; 438/514; 438/526

(58) Field of Classification Search .......... 257/57, 257/617, 628, 782, 79; 438/190, 197, 199, 438/305, 455, 471, 473, 479, 517, 526, 530, 438/549, 612  
See application file for complete search history.

(56) References Cited

U.S. PATENT DOCUMENTS

| 5,976,956 | A | * | 11/1999 | Gardner et al. | 438/473 |
| 6,087,209 | A | * | 7/2000 | Yeap et al. | 438/197 |
| 6,124,187 | A | * | 9/2000 | Tsukamoto | 438/530 |
| 7,332,410 | B2 | * | 2/2008 | Tong | 438/455 |
| 2006/0094175 | A1 | * | 5/2006 | Cohen et al. | 438/190 |
| 2008/0315213 | A1 | * | 12/2008 | Noe | 257/79 |

OTHER PUBLICATIONS

Front End Processes; International Technology Roadmap for Semiconductors, 2005 Edition.  
Lerch, W.; "Advanced Activation of Ultra-shallow Junctions using flash-assisted RTP"; E-MRS European Materials Research Society, 2005.  
Shao, L. et al.; "Athermal annealing at room temperature and enhanced activation of low-energy boron implants with high-energy Si coimplantation"; Journal of Applied Physics, vol. 92, No. 8, Oct. 15, 2002, pp. 4307-4311.  
Cowern, N., et al.; "Understanding, Modeling and Optimizing Vacancy Engineering for Stable Highly Boron-Doped Ultrashallow Junctions"; IEDM proc., 2005.  
Scholz, R. et al.; "Void formation at the interface of bonded hydrogen-terminated (100) silicon wafers"; Microscopy of Semiconducting Materials, Oxford 1999.  
Tyagi, S. et al.; "An advanced low power, high performance, strained channel 65nm technology".

* cited by examiner

*Primary Examiner*—Bradley K Smith  
*Assistant Examiner*—Errol Fernandes  
(74) *Attorney, Agent, or Firm*—Dickstein, Shapiro, LLP.

(57) ABSTRACT

A method of manufacturing a semiconductor element. A dislocation region is formed between a first layer and a second layer, the dislocation region including a plurality of dislocations. First interstitials in the first layer are at least partially eliminated using the dislocations in the dislocation region. Vacancies are formed in the second layer. Second interstitials in the second layer are at least partially eliminated using the vacancies in the second layer.

31 Claims, 6 Drawing Sheets

FIG 1A
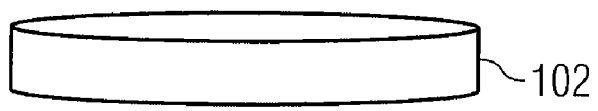
FIG 1B
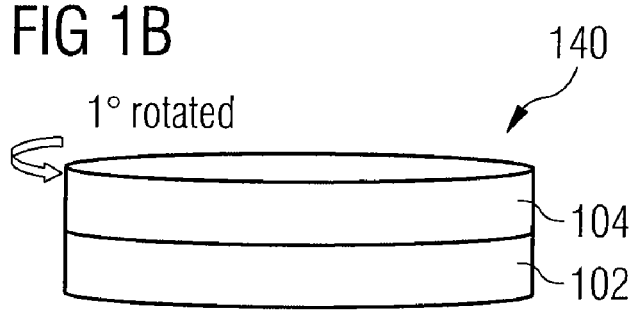
FIG 1C
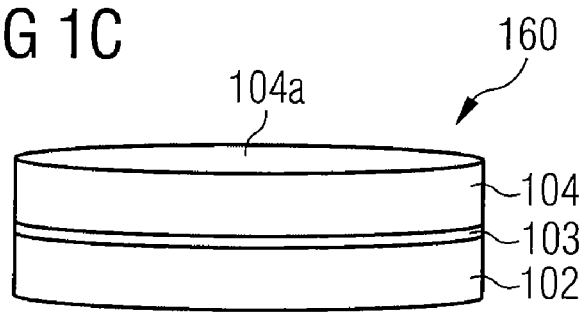
FIG 1D
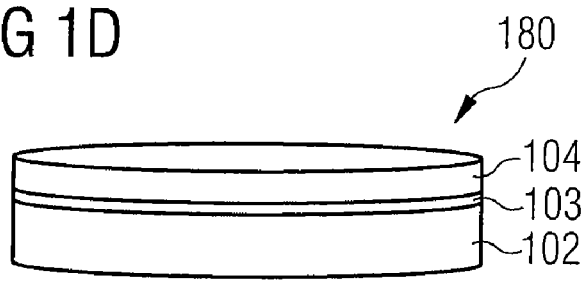

METHOD OF MANUFACTURING A SEMICONDUCTOR ELEMENT AND SEMICONDUCTOR ELEMENT

TECHNICAL FIELD OF THE INVENTION

The invention relates to a method of manufacturing a semiconductor element and to a semiconductor element.

BACKGROUND OF THE INVENTION

It is desirable to maintain the scalability of MOS (metal oxide semiconductor) devices such as, for example, MOS field effect transistors (MOSFETs) beyond the 45 nm technology node using planar bulk CMOS (complementary MOS) technologies. In this connection, methods to effectively suppress TED (transient enhanced diffusion) are desired in order to continue scaling the gate length of MOSFETs.

BRIEF DESCRIPTION OF THE FIGURES

In the following description, various embodiments of the invention are described with reference to the following drawings. In the figures, like reference characters generally refer to the same parts throughout the different views. The drawings are not necessarily to scale, emphasis instead generally being placed upon illustrating the principles of the invention.

In the drawings:

FIG. 1A to FIG. 1D show different process steps of a method of manufacturing a semiconductor element in accordance with an embodiment of the invention;

DETAILED DESCRIPTION OF THE INVENTION

Figure 2C:
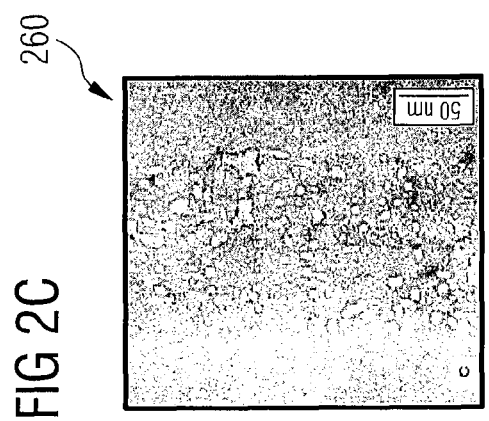
FIG. 2A to FIG. 2D show transmission electron microscopy images of smartly oriented substrates.
Figure 2B:
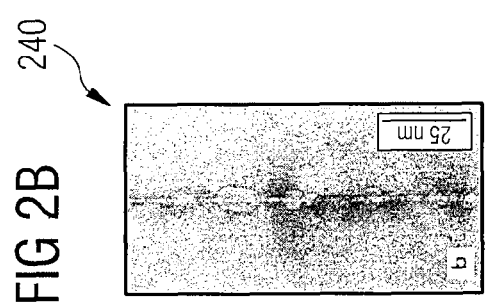
Figure 2A:
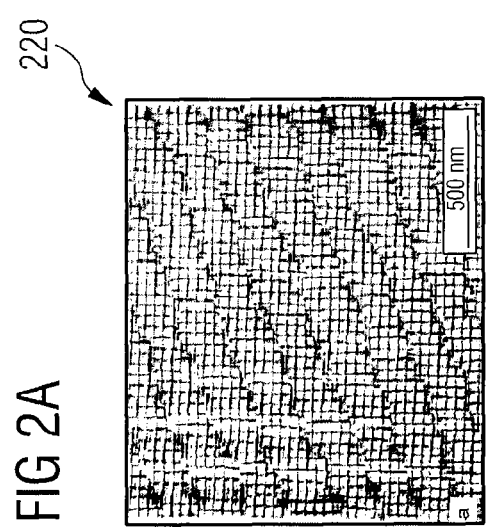
Figure 2D:
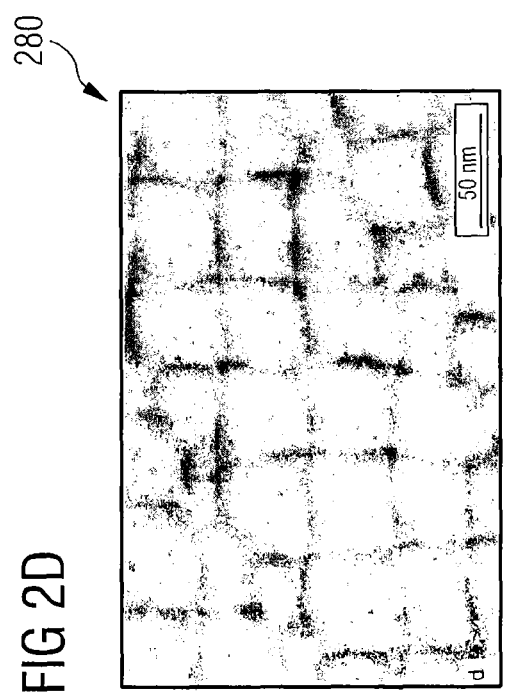

According to the International Technology Roadmap for Semiconductors (ITRS) scaling beyond the 45 nm technology node will become very difficult using planar bulk CMOS (complementary metal oxide semiconductor) devices because of the so-called "material limited device scaling". In particular, the poly length spacing should be reduced due to short channel effects mainly caused by transient enhanced diffusion (TED). Recently, in order to reduce short channel effects and to maintain poly gate scalability the use of laser annealing processes has been proposed. However, junctions produced by laser annealing have proven to suffer from poor thermal stability caused by dopant deactivation during subsequent low temperature treatments.

It is now widely accepted that both the dopant deactivation and the TED are a consequence of one and the same driving mechanism, namely a self-interstitial supersaturation, which results as an undesirable side-effect from the implantation of low-energy dopant atoms (e.g., boron atoms) into substrate layers (e.g., silicon substrate layers).

In the context of this application, the term "self-interstitial" refers to a specific type of one-dimensional point defect in a crystal lattice. In particular, a "self-interstitial" is meant to be an atom lodged in a position between normal lattice atoms, that is, in an interstice. The qualification "self" indicates, that the interstitial atom is of the same type as the normal lattice atoms. For example, in a silicon substrate, a self-interstitial would refer to a silicon atom sitting at an interstice. In the following description, the terms "self-interstitial", "interstitial" and "interstitial-type defect" are used interchangeably.

It is widely accepted that the dopant deactivation (e.g., the deactivation of boron doping atoms or boron deactivation) at low temperatures occurs due to the formation of immobile dopant-interstitial clusters (e.g., boron-interstitial clusters).

In order to produce highly active P+/N junctions suitable for the 45 nm technology node a combination of spike annealing and laser annealing has been introduced to the C45 process flow. The introduction of spike annealing on top of the laser processing is effective in suppressing boron deactivation. However, the disadvantage of this conventional method is that the combination of spike annealing and laser annealing produces deep junctions which are not suitable for the 32 nm technology node.

A conventional method to suppress boron TED is to produce an excess of vacancies (V) using a high-energy silicon implant. Unfortunately, self-interstitials (I) are also produced by the collision cascades and therefore under normal conditions bulk recombination between interstitials and vacancies eliminates also the vacancy excess produced by the high-energy silicon implant. This process is generally called dynamical annealing because it occurs during the implantation process itself or during the first milliseconds of the subsequent thermal annealing process. One conventional way to avoid dynamical annealing is to use the buried oxide layer of a silicon-on-insulator (SOI) substrate as a barrier for interstitial diffusion towards the surface. In this way it is possible to separate the vacancy and interstitial populations enabling that the vacancy-rich region exclusively recombines with the interstitials produced by the shallow boron implant. However, the introduction of SOI substrates to replace bulk silicon is not straightforward and is for many cases or applications not the preferable option.

In accordance with an embodiment of the invention, a method of manufacturing a semiconductor element is provided. The method includes forming a dislocation region between a first layer and a second layer, the dislocation region including a plurality of dislocations. The method further includes at least partially eliminating first interstitials in the first layer using the dislocations in the dislocation region. The method further includes forming vacancies in the second layer. The method further includes at least partially eliminating second interstitials in the second layer using the vacancies in the second layer.

In accordance with another embodiment of the invention, the fist layer is part of a first wafer, and the second layer is part of a second wafer, and the dislocation region is formed by bonding the first wafer to the second wafer. In other words, according to this embodiment, the first wafer includes the first layer and the second wafer includes the second layer, and by bringing the first wafer and the second wafer into mechanical contact with one another, also the first layer and the second layer are brought into mechanical contact with one another, and the dislocation region is formed at the interface between the first layer and the second layer.

In accordance with some embodiments of the invention, the bonding of the first wafer to the second wafer can be carried out using suitable wafer bonding techniques. In one embodiment, for example, the bonding of the first and second wafer may include a first thermal treatment (e.g. a low-temperature or medium temperature thermal treatment or furnace treatment) after bringing the wafers into contact. According to one embodiment, the first and second wafer may be heated to a temperature of approximately between 600° C. and 1000° C. during the first thermal treatment, and the heating may be carried out for a time duration of approximately between 5 min and 2 hours according to one embodiment.

In accordance with another embodiment of the invention, the first wafer includes a first substrate having a first crystal orientation, and the second wafer includes a second substrate having a second crystal orientation.

In accordance with another embodiment of the invention, the first crystal orientation and the second crystal orientation are the same. In other words, according to this embodiment the first substrate and the second substrate are homogeneously oriented with respect to one other.

In accordance with another embodiment of the invention, the first crystal orientation and the second crystal orientation are different from one another. In other words, according to this embodiment the first substrate and the second substrate are heterogeneously oriented with respect to one other.

In accordance with another embodiment of the invention, the first substrate has a (100) crystal orientation, and the second substrate also has a (100) crystal orientation. In accordance with an alternative embodiment, the first substrate has a (100) crystal orientation, and the second substrate has a (110) crystal orientation or a (111) crystal orientation.

In accordance with another embodiment of the invention, the first substrate includes a first semiconductor material, and the second substrate includes a second semiconductor material.

In accordance with another embodiment of the invention, at least one of the first and the second substrate includes silicon material.

In accordance with another embodiment of the invention, at least one of the first and the second substrate includes a III-V material and/or a II-VI material.

In accordance with another embodiment of the invention, the bonding of the wafers includes rotating the second wafer with respect to the first wafer by an angle (also referred to as an angle of rotation or rotation angle). In other words, the first wafer and the second wafer are rotated relative to one another and with respect to a common rotation axis which is perpendicular to the first or second wafer's main processing surface.

In accordance with another embodiment of the invention, the rotation angle is approximately between 0.1° and 50°, for example approximately between 0.5° and 10°, e.g. 1°.

In accordance with another embodiment of the invention, the dislocation region is formed in such a way, that a dislocation network is formed, the dislocation network including the plurality of dislocations and further including a plurality of voids.

In accordance with another embodiment of the invention, the dislocation region has a thickness of approximately between 0.1 nm and 10 nm, for example 1 nm, wherein the term "thickness" refers to the extension of the dislocation region in the vertical direction, that is the direction perpendicular to a main processing surface of the first layer (or first wafer) and/or second layer (or second wafer).

In accordance with another embodiment of the invention, after bonding the first and the second wafer, the second wafer is thinned, for example by means of a chemical mechanical polishing (CMP) method in one embodiment, or by means of other suitable thinning methods. After the thinning, the second wafer may have a thickness of approximately between 50 nm and 10 µm, for example 500 nm, in accordance with some embodiments.

In accordance with another embodiment of the invention, implant species (or implant atoms) are implanted into at least one of the first and the second layer, thereby forming the first interstitials in the first layer.

In accordance with another embodiment of the invention, the vacancies are formed by the implantation of the implant atoms.

In accordance with another embodiment of the invention, silicon ions (e.g., $Si^+$ ions) are used for the implantation of the implant atoms.

In accordance with another embodiment of the invention, the first interstitials and/or vacancies are formed by means of high-energy silicon implants. The high energy silicon implants can be integrated, for example, during the P-LDD (P lightly doped drain) implants and SD (Source/Drain) implants.

In accordance with another embodiment of the invention, the silicon ions have an implantation energy of approximately between 100 keV and 2000 keV, for example approximately 500 keV in one embodiment.

In accordance with another embodiment of the invention, the implantation dose of the silicon ions is approximately between $1\times10^{12}$ $cm^{-2}$ and $5\times10^{14}$ $cm^{-2}$, for example approximately $1\times10^{14}$ $cm^{-2}$.

In accordance with another embodiment of the invention, germanium ions (e.g., $Ge^+$ ions) are used for the implantation of the implant atoms.

In accordance with another embodiment of the invention, the germanium ions have an implantation energy of approximately between 10 keV and 2000 keV, for example approximately 500 keV.

In accordance with another embodiment of the invention, the implantation dose of the germanium ions is approximately between $10^{12}$ $cm^{-2}$ and $5\times10^{14}$ $cm^{-2}$, for example approximately $1\times10^{14}$ $cm^{-2}$.

In accordance with another embodiment of the invention doping atoms are implanted into the second layer, thereby forming the second interstitials in the second layer.

In accordance with another embodiment of the invention, boron atoms, phosphorus atoms or arsenic atoms are implanted into the second layer as doping atoms.

In accordance with another embodiment of the invention, low-energy boron ions (e.g. Be ions) or boron fluoride ions (e.g. $BF_2^+$ ions) or boron clusters (e.g. $B_xH_y^+$ clusters) are implanted into the second layer, thereby forming a shallow low-energy boron implant.

In accordance with another embodiment of the invention, boron ions are used for the implantation of the boron atoms, the boron ions having an implantation energy of approximately between 0.1 keV and 10 keV, for example 0.5 keV in one embodiment.

In accordance with another embodiment of the invention, the implantation dose of the boron ions used for the boron implantation is approximately between $1\times10^{13}$ $cm^{-2}$ and $5\times10^{15}$ $cm^{-2}$, for example $1\times10^{15}$ $cm^{-2}$.

In accordance with another embodiment of the invention, the first interstitials and the vacancies are formed after the formation of the dislocation region, and the second interstitials are formed after the formation of the first interstitials and the vacancies. In other words, the first interstitials and the vacancies may be formed after the formation of the dislocation region by means of an implantation of high-energy implant atoms (e.g., high-energy silicon atoms), and the second interstitials may be formed subsequently by an implantation of low-energy doping atoms (e.g., low-energy boron atoms).

In accordance with another embodiment of the invention, the first layer, the second layer and the dislocation region are subjected to a second thermal treatment after the formation of the first and second interstitials and the vacancies. For example, in accordance with one embodiment the bonded wafers may be subjected to a second thermal treatment after the implantation of the high-energy implant atoms and the low-energy doping atoms (e.g. P-LDD implants).

In accordance with another embodiment of the invention the second thermal treatment includes a rapid thermal anneal (RTA).

In accordance with another embodiment of the invention, the second thermal treatment includes spike annealing, laser annealing or flash annealing.

In accordance with another embodiment of the invention, the first and the second layer and the dislocation region are heated to a temperature of approximately between 900° C. and 1300° C. during the second thermal treatment.

In accordance with another embodiment of the invention, the first layer, the second layer and the dislocation region are heated for a duration of approximately between 1 ms and 5 min during the second thermal treatment.

Clearly, in accordance with an embodiment of the invention, a first thermal treatment may be used to assist the bonding of the first wafer to the second wafer. That is, according to this embodiment, the first layer, the second layer and the dislocation region are subjected to a first thermal treatment (for example, a low-temperature to medium-temperature furnace treatment) in connection with the wafer-bonding. In accordance with an embodiment, the first thermal treatment is carried out prior to the formation of the first and second interstitials.

In accordance with another embodiment, a second thermal treatment or anneal may additionally be applied after a P-LDD or SD implantation in order to activate the dopants (for example shallow B implants). That is, according to this embodiment, the first layer, the second layer and the dislocation region are subjected to a second thermal treatment (e.g., RTP, spike anneal, laser anneal or flash anneal).

In accordance with another embodiment of the invention, at least one doped region of the second layer forms a shallow junction of the semiconductor element, for example an ultra-shallow junction.

In accordance with another embodiment of the invention the semiconductor element is a transistor, for example a field effect transistor in accordance with one embodiment.

In accordance with another embodiment of the invention, a first doped region of the second layer forms a first source/drain region of the field effect transistor, and a second doped region of the second layer forms a second source/drain region of the field effect transistor.

In accordance with another embodiment of the invention, a semiconductor element is provided. The semiconductor element includes a first layer and a second layer. The semiconductor further includes a dislocation region formed between the first layer and the second layer, the dislocation region including a plurality of dislocations. The semiconductor element further includes at least one shallow junction formed in the second layer. Furthermore, the semiconductor element includes doping atoms in the shallow junction.

In accordance with another embodiment of the invention, the semiconductor element includes a first and a second wafer, wherein the first layer is part of the first wafer, and wherein the second layer is part of the second wafer, the second wafer being bonded to the first wafer. According to this embodiment, the dislocation region is formed between the first and the second wafer.

In accordance with another embodiment of the invention, the second wafer of the semiconductor element is rotated by an angle with respect to the first wafer of the semiconductor element.

In accordance with another embodiment of the invention, the rotation angle is approximately between 0.1° and 50°, for example approximately between 0.5° and 10°, for example 1°.

In accordance with another embodiment of the invention, the dislocation region of the semiconductor element includes a dislocation network, the dislocation network including the plurality of dislocations and a plurality of voids.

In accordance with another embodiment of the invention, the semiconductor element is a field effect transistor.

In accordance with another embodiment of the invention, the at least shallow junction of the semiconductor element forms at least one source/drain region of the field effect transistor.

In accordance with another embodiment of the invention, a method of manufacturing a semiconductor element in a substrate is provided. The method includes forming a plurality of dislocations between a first layer and a second layer of the substrate. This plurality of dislocations or dislocation network may act as an effective barrier for self-interstitial diffusion. The method further includes implanting a plurality of implants (e.g. using high-energy $Si^+$ or $Ge^+$ ions) into the first and second layer, thereby forming a plurality of point defects (i.e. self-interstitials (I) or vacancies (V)). In accordance with certain embodiments, the high energy Si (or Ge) implants produce collision cascades which effectively displace the V population from the I population. The majority of the interstitials may be effectively located in the first layer and may be unable to fully recombine with the V population preferentially located in the second layer. A flux of interstitials from the first layer to the second layer may be prevented by the presence of the plurality of dislocations which may act as an effective barrier for point defect diffusion.

FIG. 1A shows a process step 120 of a method of manufacturing a semiconductor element in accordance with an embodiment of the invention. In accordance with this embodiment, a field effect transistor is produced.

In FIG. 1A, a first wafer 102 and a second wafer 104 are shown. The first wafer 102 includes a first layer, and the second wafer 104 includes a second layer. The first wafer 102 includes a first substrate having a first crystal orientation, and the second wafer 104 includes a second substrate having a second crystal orientation. According to the embodiment shown in FIG. 1A, the first wafer 102 includes a silicon substrate having a (100) crystal orientation (also referred to as a Si (100) substrate), and the second wafer 104 includes a silicon substrate having a (110) crystal orientation (also referred to as a Si (110) substrate). In alternative embodiments, the first wafer 102 and/or the second wafer 104 may include a substrate having a different crystal orientation and/or a different substrate material. For example, according to another embodiment the second wafer 104 may also include a silicon (100) substrate. In another embodiment, the second wafer 104 may include a silicon (111) substrate. The first wafer 102 and/or the second wafer 104 may be hydrogen-terminated silicon wafers, each wafer including a surface with hydrophilic silicol (SiOH) functional groups.

FIG. 1B shows another process step 140 of the method of manufacturing a semiconductor element in accordance with the embodiment of the invention. It is shown the bonding of the first wafer 102 to the second wafer 104, wherein the second wafer 104 is rotated by an angle (also referred to as rotation angle) of 1° (one degree) with respect to the first wafer 102. In alternative embodiments, the second wafer 104 may be rotated by a different angle. By bringing the first wafer 102 and the second wafer 104 into mechanical contact with one another, a bond is formed between the first wafer 102 and the second wafer 104 (so-called wafer bonding), for example due to the formation of hydrogen bridges between the SiOH groups at the surface of the first wafer 102 and the SiOH groups at the surface of the second wafer 104. The strength of the bond can be increased, for example, by applying a thermal treatment (e.g., thermal anneal) to the bonded wafers 102, 104. According to one embodiment, for example, the first wafer 102 and the second wafer 104 may be heated to a temperature of approximately between 600° C. and 1000° C., and the heating may be carried out for a time duration of approximately between 5 min and 2 hours.

FIG. 1C shows another process step 160 of the method of manufacturing a semiconductor element in accordance with the embodiment of the invention. It is shown that a dislocation region 103 is formed between the first wafer 102 and the second wafer 104, wherein the dislocation region 103 includes a plurality of dislocations. In other words, a region 103 is formed at the interface of the first wafer 102 and the second wafer 104, the region 103 including a plurality of dislocations. The formation of dislocations can be attributed to the rotation of the second wafer 104 with respect to the first wafer 102 (see FIG. 1B). The dislocation region 103 may include a dislocation network which extends over the whole contact or interface area of the two wafers 102, 104, but does not extend towards the surface of the top silicon layer, that is towards the top surface 104a of the second wafer 104. In other words, the dislocation region 103 may have a lateral dimension that is approximately equal to the lateral dimension of the first wafer 102 or the second wafer 104, and may have a thickness, which is small compared to the thickness of the second wafer 104. In some embodiments, for example, the thickness of the dislocation region 103 may be approximately between 0.1 nm and 10 nm.

FIG. 1D shows another process step 180 of the method of manufacturing a semiconductor element in accordance with the embodiment of the invention. It is shown a thinning of the second wafer 104, in other words the removal of an upper portion of the second wafer 104, thereby obtaining a thinner layer. The removal of the wafer material of the second wafer 104 can be carried out, for example, by polishing, for example by chemical mechanical polishing (CMP). Clearly, after polishing the top layer of the layer structure 102/103/104, a substrate is obtained, which consists of a thin (110) layer sitting on top of a (100) silicon substrate. The layer arrangement 102/103/104 shown in FIG. 1D is also referred to as "smartly oriented substrates" (SMARTOS). In other words, FIG. 1A to FIG. 1D show the manufacturing of smartly oriented substrates by bonding two hydrogen-terminated silicon wafers twisted by one degree, the smartly oriented substrates including a dislocation region 103 formed at the interface of the bonded wafers 102, 104.

Due to the twist component of misorientation a dislocation region 103 is formed at the original bonded interface between the first wafer 102 and the second wafer 104, wherein the dislocation region 103 may include a network of dislocations and voids, as is shown in FIG. 2, which shows plan-view (PVTEM) and cross-sectional (XTEM) transmission electron microscopy analyses of smartly oriented substrates.

FIG. 2 shows four different TEM images 220, 240, 260, 280 of a wafer bonding interface after a rapid thermal anneal (RTA) at 700° C. for 10 minutes. In a first TEM image 220, a plan-view survey image of a dislocation network is shown, revealing twist and tilt component. A second TEM image 240 is a Fresnel-contrast image of a cross-section edge-on image at underfocus showing minute voids at the interface. In a third TEM image 260, a distribution of voids in a thicker cross section region is shown after tilting by about 40°. A fourth TEM image 280 shows an enlarged section of the interface (plan-view) at overfocus setting with the voids showing a dark contrast among dislocations. From FIG. 2 it can be seen that the XTEM analyses reveal the presence of a network of voids at the wafer bonding interface (see second micrograph 240) in addition to the network of dislocations.

Figure 3A:
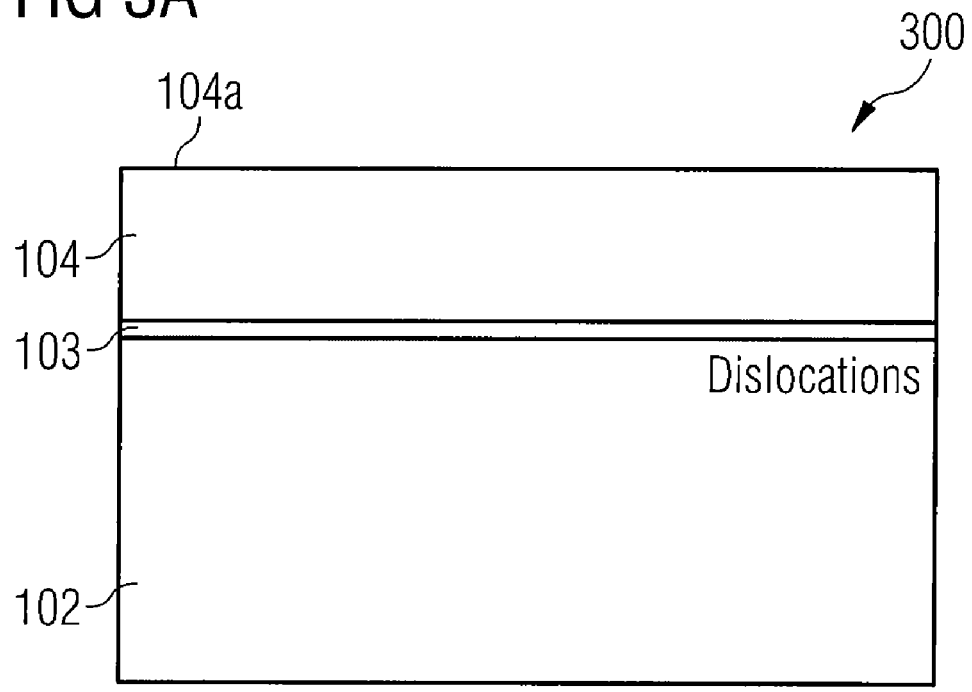
FIG. 3A to FIG. 3D show cross-sectional views of a layer structure shown in FIG. 1D in order to illustrate other process steps of the method of manufacturing a semiconductor element in accordance with the embodiment of the invention.

FIG. 3A shows a cross-sectional view 300 of the layer arrangement 102/103/104 shown in FIG. 1D with the dislocation region 103 formed between the first wafer 102 and the second wafer 104.

Figure 3B:
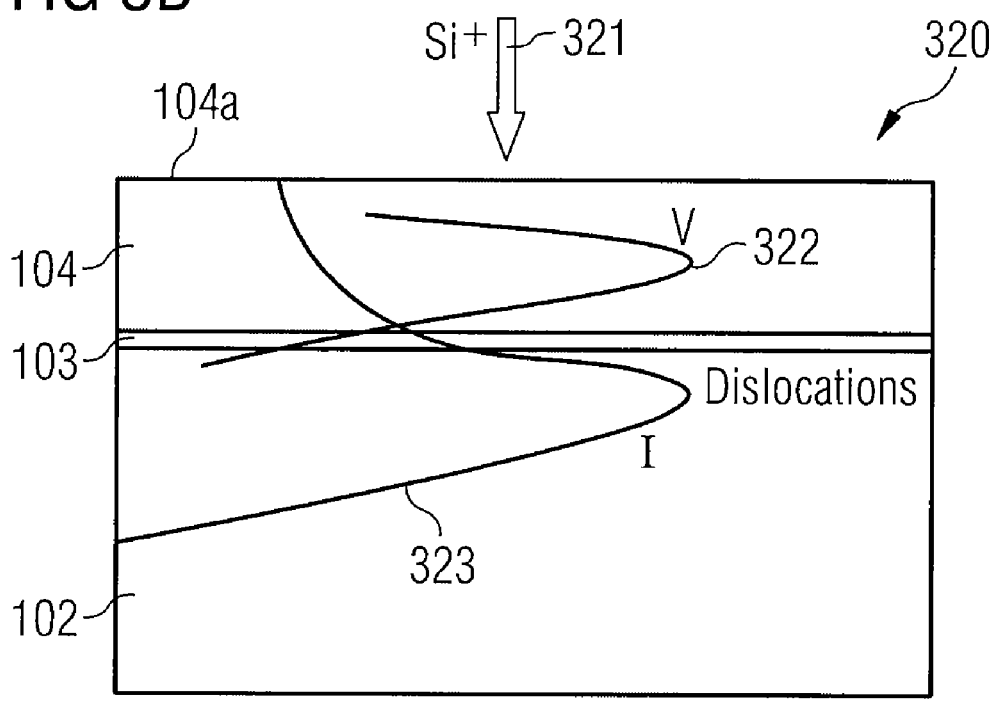

FIG. 3B shows another cross-sectional view 320 of the layer arrangement shown in FIG. 1D in order to illustrate another process step of the method of manufacturing a semiconductor element in accordance with the embodiment of the invention.

In the process step illustrated in FIG. 3B, silicon atoms are implanted into the bonded wafer structure. According to the embodiment shown, the implantation of silicon atoms is carried out by using high-energy silicon ions ($Si^+$ ions), represented by an arrow 321 in FIG. 3B. The $Si^+$ ions 321 may have, for example, an implantation energy of approximately between 100 keV and 2000 keV, for example 500 keV, and an implantation dose of approximately between $1 \times 10^{12}$ cm$^{-2}$ and $5 \times 10^{14}$ cm$^{-2}$, for example $1 \times 10^{14}$ cm$^{-2}$.

By means of the silicon implantation, vacancies (V) are formed in the second layer of the second wafer 104, the concentration profile of the vacancies being represented by a first concentration curve 322 in FIG. 3B. From the first concentration curve 322 it can be seen that the majority of the vacancies (V) are formed in the second layer, that is in the second wafer 104. In particular, the concentration maximum or peak of the vacancy distribution 322 is located in the second wafer 104 about halfway in-between the dislocation region 103 and the top surface 104a of the second wafer 104.

In addition to the formation of the vacancies (V), Si self-interstitials (I) are also formed by the high-energy silicon implantation. That is, a plurality of first interstitials are formed in the first layer of the first wafer 102, the concentration profile of the first interstitials being represented by a second concentration curve 323 in FIG. 3B. From the second concentration curve 323 it can be seen that the majority of the first interstitials (I) are formed in the first layer, that is in the first wafer 102. In particular, the concentration maximum or peak of the first interstitial distribution 323 is located in the first wafer 102 near the dislocation region 103.

Clearly, FIG. 3B shows that by means of the high-energy silicon implantation 321 vacancies (V) are formed in the second layer of the second wafer 104 and first interstitials (I) are formed in the first layer of the first wafer 102. Clearly, a vacancy-rich region is formed in the second wafer 104 near a shallow implanted boron profile, which is formed in a subsequent process step of the method (see FIG. 3C). From FIG. 3B it can also be seen that the vacancy population 322 and the first interstitial population 323 are separated from one another by the dislocation region 103. In other words, by the formation of the dislocation region 103 or dislocation network it is made possible to separate the vacancy and interstitial populations formed by the high-energy silicon implantation, thereby making it possible that the vacancies in the vacancy-rich region exclusively or almost exclusively recombine with second interstitials formed subsequently by the shallow boron implant (see FIG. 3C).

Figure 3C:
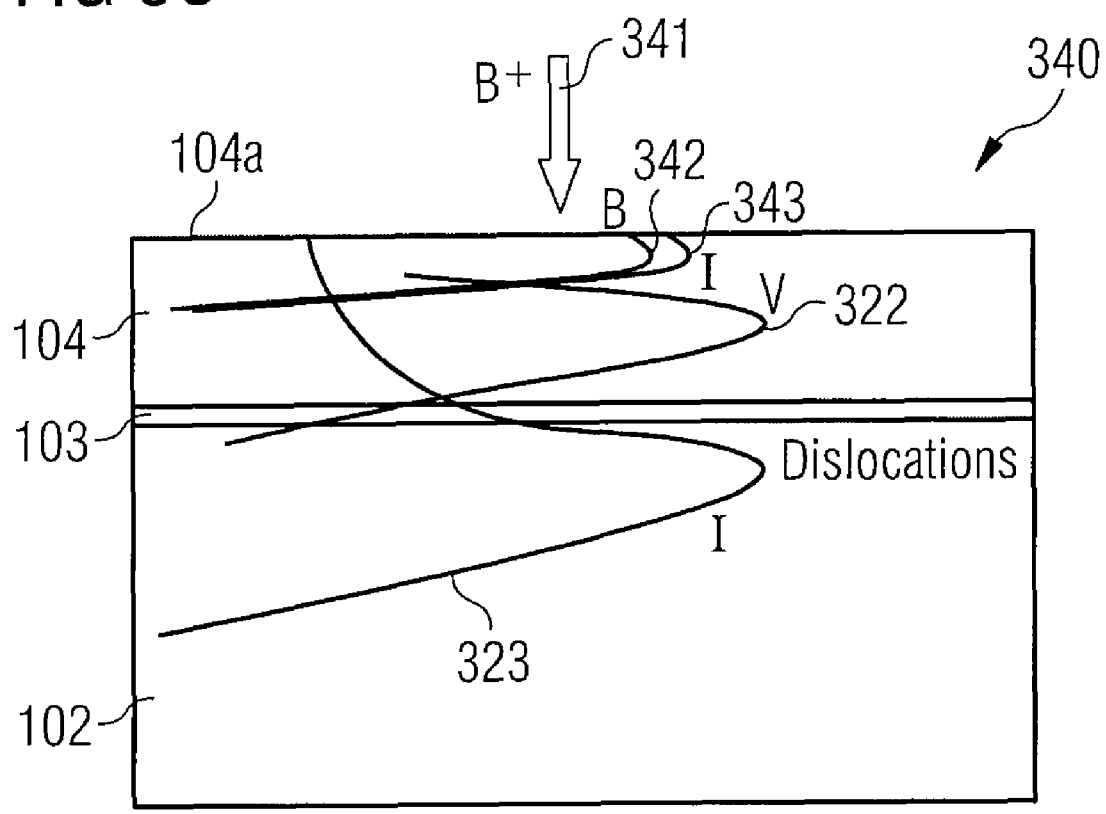

FIG. 3C shows another cross-sectional view 340 of the layer arrangement shown in FIG. 1D in order to illustrate another process step of the method of manufacturing a semiconductor element in accordance with the embodiment of the invention.

In the process step illustrated in FIG. 3C, boron atoms are implanted as doping atoms into the bonded wafer structure. According to the embodiment shown, the implantation of boron atoms is carried out by using low-energy boron ions (B+ ions), represented by an arrow 341 in FIG. 3C. The B+ ions 341 may have, for example, an implantation energy of approximately between 0.1 keV and 10 keV, for example 0.5 keV, and an implantation dose of approximately between $1 \times 10^{13}$ cm$^{-2}$ and $5 \times 10^{15}$ cm$^{-2}$, for example $1 \times 10^{15}$ cm$^{-2}$.

By means of the low-energy boron implantation, a shallow boron (B) implant profile is formed, represented by a third concentration curve 342 in FIG. 3C. From the third concentration curve 342 it can be seen that the maximum or peak of the boron (B) implant profile is located near the top surface 104a of the second wafer 104.

In addition to the formation of the boron implant profile 342, second interstitials (I) are also formed by the low-energy boron implantation. That is, a plurality of second interstitials are formed in the second layer of the second wafer 104, the concentration profile of the second interstitials being represented by a fourth concentration curve 343 in FIG. 3C. From the fourth concentration curve 343 it can be seen that the second interstitials (I) are formed completely or almost completely in the second layer, that is in the second wafer 104. In particular, the concentration maximum or peak of the second interstitial distribution 343 is located in the second wafer 104 near the top surface 104a of the second wafer 104. It can also be seen that the maximum value of the second interstitial profile 343 is smaller than the value of the concentration maximum of the vacancy distribution 322.

Clearly, FIG. 3C shows a low-energy boron implantation into the smartly oriented substrates, wherein a shallow implanted boron profile 342 is formed in the second wafer 104, and wherein furthermore second interstitials (represented by the fourth concentration curve 343) are also formed in the second wafer 104. From FIG. 3C it can also be seen that the vacancy-rich region (corresponding to the peak of the first concentration curve 322) formed by the high-energy silicon implantation 321 is located near the shallow implanted boron profile 342. The vacancy-rich region may serve to suppress boron TED, in that in another process step of the method (cf. FIG. 3D) the second interstitials at least partially recombine with the vacancies of the vacancy-rich region, thereby preventing a supersaturation of interstitials in the second wafer 104.

Figure 3D:
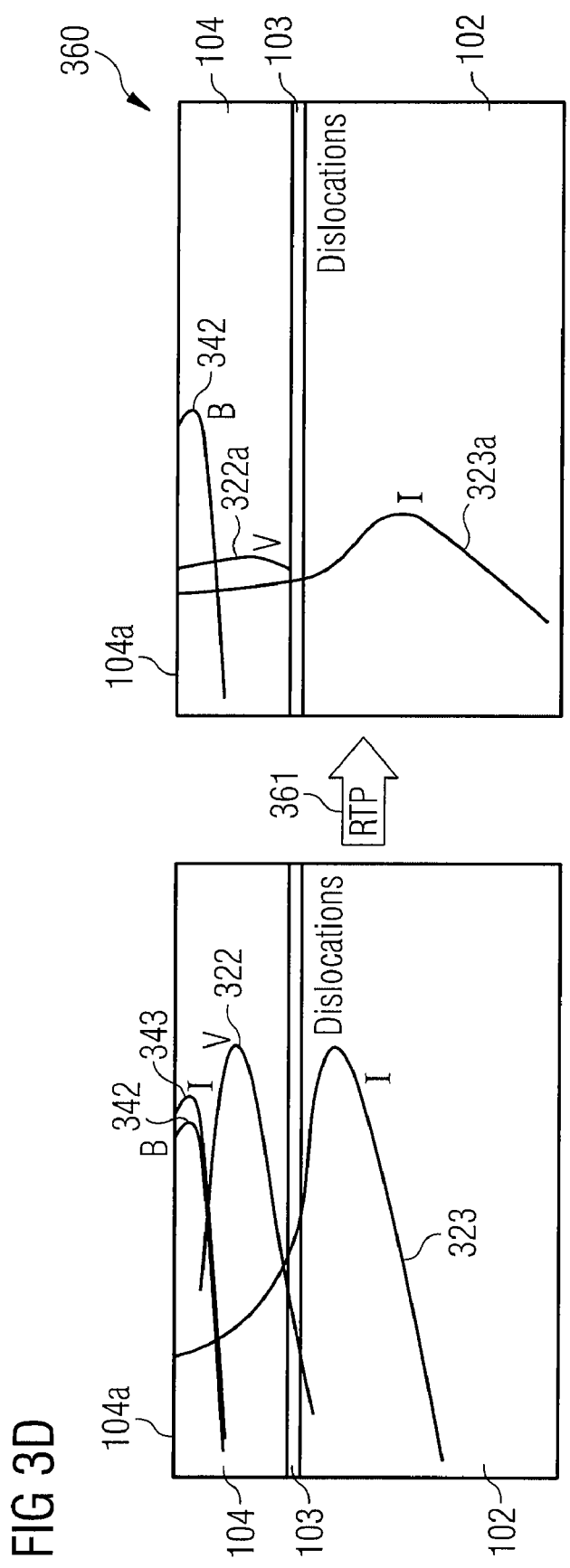

FIG. 3D shows another cross-sectional view 360 of the layer arrangement shown in FIG. 1D in order to illustrate another process step of the method of manufacturing a semiconductor element in accordance with the embodiment of the invention.

It is shown a rapid thermal processing (RTP) step 361. In other words, the SMARTOS structure, that is the bonded wafers 102, 104 with the dislocation region 103 in-between together with the implanted atoms, are subjected to a thermal treatment (for example, a rapid thermal anneal (RTA)).

During the RTP process step 361 point defect recombination occurs at or near the surface of the smartly oriented substrates (that is at the top surface 104a of the second wafer 104) while the dislocation region 103 serves as a diffusion barrier for interstitial diffusion.

In other words, the second interstitials (or interstitial-type defects) 343 as well as those first interstitials 323, which are located in the second wafer 104 and above the dislocation region 103, may recombine with the vacancies 322, which are also located in the second wafer 104, whereas those first interstitials 323, which are located below the dislocation region 103, are prevented to diffuse towards the surface 104a due to the presence of the dislocation region 103 since the dislocations and voids of the dislocation network serve as sinks for these first interstitials 323. Thus, the dislocation region 103 prevents a supersaturation of interstitials at or near the surface of the second wafer 104.

As a result of the point defect recombination at the surface 104a, both the concentration of the vacancies 322 and the concentrations 323, 343 of the first and second interstitials in the second wafer 104 decrease, yielding on the one hand a modified vacancy concentration profile (represented by a fifth concentration curve 322a) which is considerably flatter compared to the vacancy concentration profile 322 obtained after the silicon implantation 321 and before the rapid thermal processing step 361, while on the other hand the second interstitials 343 in the second wafer 104 are eliminated or at least partially eliminated (indicated by a missing concentration curve for the second interstitials in the right-hand diagram of FIG. 3D), and also the concentration of the first interstitials 323 in the second wafer 104 is reduced (indicated by a sixth concentration curve 323a having a flatter slope in the second wafer 104 compared to the second concentration curve 323).

Furthermore, due to the dislocation region 103, which serves as a sink for interstitials, the concentration of the first interstitials 323 in the first wafer 102 decreases, yielding a flatter shape of the sixth concentration 323a in the first wafer 104 compared to the second concentration curve 323 obtained after the silicon implantation 321 and before the thermal treatment 361. In other words, the first interstitials, formed in the first layer (that is, the first wafer 102 according to this embodiment) during the Si$^+$ implantation 321, are at least partially eliminated using the dislocations in the dislocation region 103. Furthermore, the second interstitials, formed in the second layer (that is, the second wafer 104 according to this embodiment) during the Si$^+$ implantation 321, are at least partially eliminated using the vacancies in the second layer 104.

Clearly, FIG. 3D shows that first interstitials diffusing from the bulk of the wafer-bonded structure 102/103/104 towards the surface 104a are captured by the dislocation region 103, or, more precisely, by the dislocations and/or voids in the dislocation region 103, which serve as sinks or capture sites for interstitials, such that an interstitial supersaturation in the second wafer 104 is prevented, as the first interstitials concretely do not "arrive" in the second wafer 104. Thus, the vacancies formed in the second wafer 104 by the high-energy silicon implantation do almost exclusively recombine with the second interstitials also formed in the second wafer 104, thereby at least partially eliminating the second interstitials and thus suppressing or removing the source of TED.

Figure 3E:
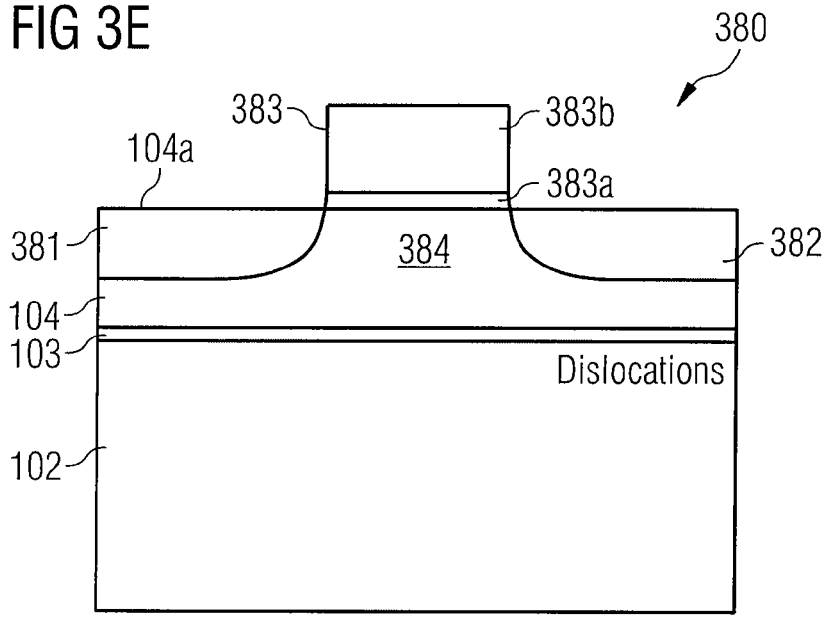
FIG. 3E shows a field effect transistor in accordance with an embodiment of the invention.

FIG. 3E shows a field effect transistor 380, which has been produced by a method of manufacturing a semiconductor element in accordance with an embodiment of the invention. In order to produce the field effect transistor 380, the method steps described in connection with FIG. 1A to FIG. 1D and FIG. 3A to FIG. 3D may be carried out. Furthermore, an N-well 384 has been formed in the second wafer 104. The N-well 384 may be formed, for example, by means of implantation of phosphorous or arsenic implants. Furthermore, a gate structure 383 (or gate stack 383) has been formed. The gate structure 383 may be formed by a known method, for example, in that the main processing surface of the second wafer 104 (that is, the top surface 104a of the second wafer 104 according to this embodiment) is oxidized and a polysilicon layer is formed thereon. By means of patterning the polysilicon layer and the silicon dioxide layer the gate structure 383 with a gate oxide 383a and a gate electrode 383b made of polysilicon is formed. In addition, a first source/drain region 381 and a second source/drain region 382 are formed within the second wafer 104. The source/drain regions 381, 382 may, for example, be formed in the second wafer 104 by means of a boron implantation (in general, by means of a source/drain implantation) using the gate structure 383 as a mask, for example. In other words, by using the gate structure 383 as a mask, a first source/drain region 381 and a second source/drain region 382 are formed within the second wafer 104 next to the gate structure 383 by means of implanting boron atoms into the second wafer 104. The implantation of boron can be carried out by using $B^+$ ions as implantation ions during implantation (cf. $B^+$ ion implantation 341 in FIG. 3C. Having formed the source/drain regions 381, 382 in the second wafer 104, clearly a field effect transistor 380 with P+/N junctions is accomplished, which in comparison to conventional field effect transistors has less interstitial-type defects. Thus, the TED of boron atoms in the produced field effect transistor 380 is also reduced compared to conventional field effect transistors.

Figure 4:
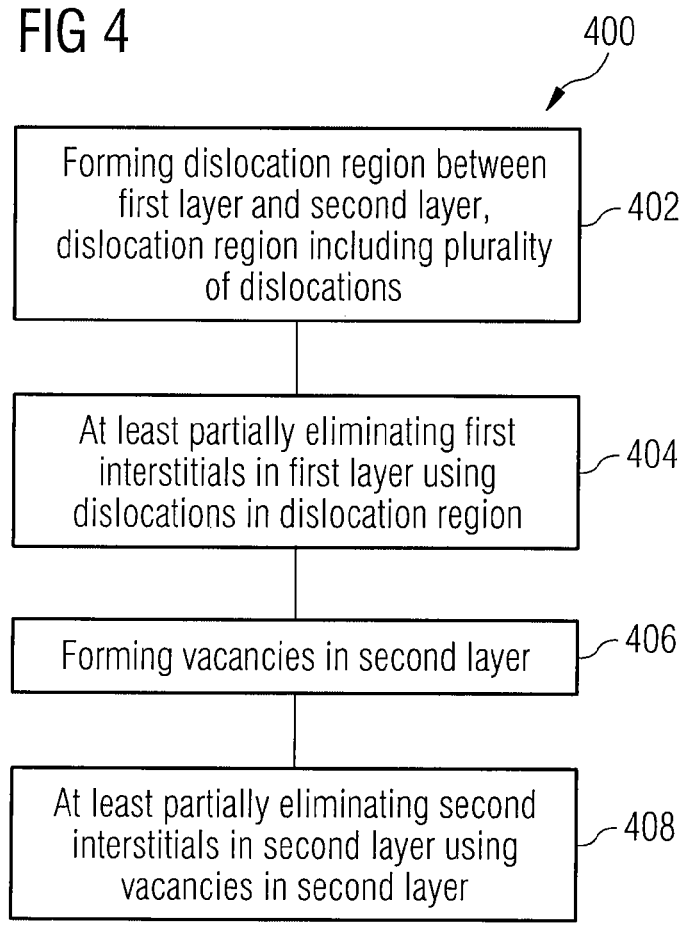
FIG. 4 shows a method of manufacturing a semiconductor element in accordance with another embodiment of the invention.

FIG. 4 shows a method 400 of manufacturing a semiconductor element in accordance with another embodiment of the invention.

In one step 402 of the method, a dislocation region is formed between a first layer and a second layer, wherein the dislocation region includes a plurality of dislocations. The dislocation region or the dislocations can be formed, for example, in accordance with one of the embodiments described above.

In another step 404 of the method, first interstitials in the first layer are at least partially eliminated using the dislocations in the dislocation region. The elimination of the first interstitials can be carried out, for example, in accordance with one of the embodiments described above.

In another step 406 of the method, vacancies are formed in the second layer. The formation of the vacancies in the second layer can be carried out, for example, in accordance with one of the embodiments described above.

In another step 408 of the method, second interstitials in the second layer are at least partially eliminated using the vacancies in the second layer. The elimination of the second interstitials can be carried out, for example, in accordance with one of the embodiments described above.

In addition to the foregoing detailed description of exemplary embodiments, further features and effects of certain embodiments of the invention are pointed out in the following.

In accordance with an embodiment of the invention, a method of manufacturing a semiconductor element (for example, a field effect transistor) is provided, which can be easily integrated into a CMOS process flow, for example into a bulk CMOS process flow.

In accordance with another embodiment of the invention, a method of manufacturing a semiconductor element is provided, which method allows to maintain the scalability of PMOS devices beyond the 45 nm technology node using planar bulk CMOS.

In accordance with another embodiment of the invention, it is made possible to form highly active P+/N ultra-shallow junctions suitable for the 32 nm node by applying a vacancy engineering technique into a specially designed substrate architecture referred to as "smartly oriented substrate" architecture or SMARTOS architecture.

In accordance with another embodiment of the invention, transient enhanced diffusion (TED) and dopant deactivation are reduced in smartly oriented substrates (SMARTOS) by means of vacancy engineering.

In accordance with another embodiment of the invention, vacancies are formed in a region at or near the surface of a SMARTOS layer structure by means of high-energy implants, for example, high-energy silicon implants. The high-energy silicon implants can be integrated, for example, during the P-LDD and SD implants.

In accordance with another embodiment of the invention, a dislocation region is formed at the interface between a first layer (e.g., of a first wafer) and a second layer (e.g., of a second wafer) of a semiconductor element, the dislocation region including a plurality or network of dislocations and voids. The dislocations and/or voids may serve as sinks for interstitials generated during an implantation step, thereby preventing the diffusion of interstitials towards the surface of the semiconductor element and thus preventing the supersaturation of interstitials in a region at or near the surface. According to one embodiment, the dislocation network can be kept far enough away from one or more P+/N junctions in the semiconductor element, such that no detrimental effects on the device performance are expected.

In accordance with another embodiment of the invention, SMARTOS substrates are used, the use of SMARTOS substrates being fully compatible to bulk silicon. According to one embodiment, using SMARTOS, it is for example possible to fabricate CMOS devices in both (110) and (100) substrates, thereby enhancing device performance for both P-type field effect transistors (PFET) and N-type field effect transistors (NFET).

In accordance with another embodiment of the invention, by means of bonding two wafers with a slight twist component with respect to one another, a dislocation region is formed at or near the bonding interface, the dislocation region including a plurality of dislocations and voids.

In accordance with another embodiment of the invention, by means of coupling the use of vacancy engineering into SMARTOS substrates, TED and boron deactivation can be effectively suppressed.

In accordance with another embodiment of the invention, a vacancy-rich region is formed near a shallow implanted boron profile, the vacancy-rich region being able to suppress boron TED. According to one embodiment of the invention, the excess of vacancies is produced by a high-energy silicon implant.

In accordance with another embodiment of the invention, a supersaturation of interstitials near a shallow dopant implant region is prevented by the formation of a dislocation region which serves as a barrier for interstitial diffusion towards the surface. By eliminating the self-interstitial supersaturation near the surface, the main source of TED can be eliminated.

In accordance with another embodiment of the invention, a SMARTOS substrate is used including two hydrogen-terminated silicon wafers bonded with a slightly rotated angle (e.g., rotated by 1°). As a direct consequence of the rotation a dislocation network is formed at the bonded interface. This network of dislocations may extend over the whole wafer but does not extend towards the surface of the top silicon layer. The nature of this band of defects is intrinsic (vacancy-type), therefore making the defects excellent capture sites for interstitials (I) coming from the substrate. Furthermore, in order to accommodate the extra volume at the bonded interface, a high density of voids may also be formed. The capture of interstitials at the band of defects and voids makes it possible that the whole or almost the whole vacancy population near the surface recombines with the "+1" damage produced by a shallow low-energy boron implant. The confinement of the vacancy supersaturation at the near surface makes it possible that the source of TED (namely the interstitials produced by the shallow boron implant) is effectively removed. In accordance with an embodiment of the invention, the substrate includes wafer-bonded layers. Thus, according to this embodiment it is also possible to use heterogeneously oriented substrates, for example bonding a (110) silicon wafer to a (100) wafer. By using heterogeneous substrates it is, for example, possible to produce NFET transistors in (100) substrates by etching away the original (110) oriented surface and growing an (100) epitaxial silicon layer. In this way the scalability of the poly gate can be retained and at the same time the performance of both PFET and NFET devices can be increased.

While the invention has been shown and described with reference to specific embodiments, it should be understood by those skilled in the art that various changes in form and detail may be made therein without departing from spirit and scope of the invention as defined by the appended claims. The scope of the invention is thus indicated by the appended claims and all changes that come within the meaning and range of equivalency of the claims are intended to be embraced.

What is claimed is:

1. A method of manufacturing a semiconductor element, comprising:
    forming a dislocation region between a first layer and a second layer, the dislocation region comprising a plurality of dislocations;
    implanting implant atoms into at least one of the first and the second layer, thereby forming first interstitials in the first layer;
    at least partially eliminating the first interstitials in the first layer using the dislocations in the dislocation region;
    forming vacancies in the second layer;
    implanting doping atoms into the second layer, thereby forming second interstitials in the second layer; and
    at least partially eliminating the second interstitials in the second layer using the vacancies in the second layer.

2. The method according to claim 1,
    wherein the first layer is part of a first wafer;
    wherein the second layer is part of a second wafer; and
    wherein the dislocation region is formed by bonding the first wafer to the second wafer.

3. The method according to claim 2,
    wherein the first wafer comprises a first substrate having a first crystal orientation, and wherein the second wafer comprises a second substrate having a second crystal orientation.

4. The method according to claim 3,
    wherein the first substrate has a (100) crystal orientation, and wherein the second substrate has a (110) crystal orientation or a (111) crystal orientation.

5. The method according to claim 3,
    wherein the first substrate comprises a first semiconductor material, and wherein the second substrate comprises a second semiconductor material.

6. The method according to claim 5,
    wherein at least one of the first and the second substrates comprises silicon material.

7. The method according to claim 2,
    wherein the bonding of the wafers comprises rotating the second wafer with respect to the first wafer by an angle.

8. The method according to claim 7,
    wherein the rotation angle is approximately between 0.1° and 50°.

9. The method according to claim 1,
    wherein the dislocation region is formed in such a way, that a dislocation network is formed, the dislocation network comprising the plurality of dislocations and further comprising a plurality of voids.

10. The method according to claim 1,
    wherein the vacancies are formed by the implantation of the implant atoms.

11. The method according to claim 1,
    wherein silicon ions are used for the implantation of the implant atoms.

12. The method according to claim 11,
    wherein the silicon ions have an implantation energy of approximately between 100 keV and 2000 keV.

13. The method according to claim 11,
    wherein the implantation dose of the silicon ions is approximately between $1\times10^{12}$ cm$^{-2}$ and $5\times10^{14}$ cm$^{-2}$.

14. The method according to claim 1,
    wherein germanium ions are used for the implantation of the implant atoms.

15. The method according to claim 14,
    wherein the germanium ions have an implantation energy of approximately between 10 keV and 2000 keV.

16. The method according to claim 14,
    wherein the implantation dose of the germanium ions is approximately between $1\times10^{12}$ cm$^{-2}$ and $5\times10^{14}$ cm$^{-2}$.

17. The method according to claim 1,
    further comprising implanting boron atoms, phosphorous atoms or arsenic atoms into the second layer as the doping atoms.

18. The method according to claim 17,
    wherein the boron ions are used for the implantation of the doping atoms, the boron ions having an implantation energy of approximately between 0.1 keV and 10 keV.

19. The method according to claim 17,
    wherein the boron ions are used for the implantation of the doping atoms, and wherein the implantation dose of the boron ions is approximately between $1\times10^{13}$ cm$^{-2}$ and $5\times10^{15}$ cm$^{-2}$.

20. The method according to claim 1,
    wherein the first interstitials and the vacancies are formed after the formation of the dislocation region; and
    wherein the second interstitials are formed after the formation of the first interstitials and the vacancies.

21. The method according to claim 2,
    wherein the bonding of the first wafer to the second wafer comprises subjecting the first and the second layer and the dislocation region to a first thermal treatment.

22. The method according to claim 21,
    wherein the first and the second layer and the dislocation region are heated to a temperature of approximately between 600° C. and 1000° C. during the first thermal treatment.

23. The method according to claim 21,
    wherein the first and the second layer and the dislocation region are heated for a duration of approximately between 5 mm and 2 hours during the first thermal treatment.

24. The method according to claim 1,
    further comprising subjecting the first and the second layer and the dislocation region to a second thermal treatment after the implantation of the doping atoms.

25. The method according to claim 24,
wherein the second thermal treatment comprises at least one of the following processes:
- a rapid thermal annealing process;
- a spike annealing process;
- a flash annealing process; and
- a laser annealing process.

26. The method according to claim 24,
wherein the first and the second layer and the dislocation region are heated to a temperature of approximately between 900° C. and 1300° C. during the second thermal treatment.

27. The method according to claim 24,
wherein the first and the second layer and the dislocation region are heated for a duration of approximately between 1 ms and 5 mm during the second thermal treatment.

28. The method according to claim 1,
wherein at least one doped region of the second layer forms a shallow junction of the semiconductor element.

29. The method according to claim 28,
wherein the semiconductor element is a transistor.

30. The method according to claim 29,
wherein the semiconductor element is a field effect transistor.

31. The method according to claim 30,
wherein a first doped region of the second layer forms a first source/drain region of the field effect transistor; and
wherein a second doped region of the second layer forms a second source/drain region of the field effect transistor.

* * * * *